United States Patent
Ha

(10) Patent No.: US 10,468,116 B2
(45) Date of Patent: Nov. 5, 2019

(54) METHODS OF OPERATING A MEMORY DEVICE

(71) Applicant: MICRON TECHNOLOGY, INC., Boise, ID (US)

(72) Inventor: Chang Wan Ha, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 35 days.

(21) Appl. No.: 15/689,459

(22) Filed: Aug. 29, 2017

(65) Prior Publication Data

US 2017/0365358 A1 Dec. 21, 2017

Related U.S. Application Data

(60) Continuation of application No. 14/880,504, filed on Oct. 12, 2015, now Pat. No. 9,831,002, which is a
(Continued)

(51) Int. Cl.
| | |
|---|---|
| *G11C 29/44* | (2006.01) |
| *G06F 11/07* | (2006.01) |
| *G11C 29/00* | (2006.01) |
| *G06F 11/20* | (2006.01) |
| *G11C 29/38* | (2006.01) |

(Continued)

(52) U.S. Cl.
CPC ............ *G11C 29/44* (2013.01); *G06F 11/073* (2013.01); *G06F 11/0727* (2013.01); *G06F 11/0772* (2013.01); *G06F 11/2094* (2013.01); *G11C 29/38* (2013.01); *G11C 29/82* (2013.01); *G11C 15/00* (2013.01); *G11C 29/08* (2013.01); *G11C 2029/4402* (2013.01)

(58) Field of Classification Search
CPC ......... G11C 29/44; G11C 29/82; G11C 29/38; G11C 15/00; G11C 29/08; G11C 2029/4402; G06F 11/0772; G06F 11/073; G06F 11/0727; G06F 11/2094
See application file for complete search history.

(56) References Cited

U.S. PATENT DOCUMENTS

| | | |
|---|---|---|
| 5,347,484 A | 9/1994 | Kwong et al. |
| 6,145,055 A | 11/2000 | Fujimoto |
| (Continued) | | |

OTHER PUBLICATIONS

Lu, Shyue-Kung et al. :Efficient Built-In Self-Repair Techniques for Multiple Repairable Embedded Rams, IEEE Transactions on Computer-Aided Design of Integrated Circuits and Systems, Apr. 2012, vol. 31, No. 4, pp. 620-629.

*Primary Examiner* — Thien Nguyen
(74) *Attorney, Agent, or Firm* — Dicke, Billig & Czaja, PLLC

(57) ABSTRACT

Methods of operating a memory device include comparing an input address to one or more addresses stored in the memory device and indicative of problematic memory cells of the memory device, determining a status value of an indicator corresponding to a matched address if the input address matches a stored address, and storing data corresponding to the input address to a first memory array of the memory device and to a second memory array of the memory device if the indicator has a first status value. Methods may further include storing the data corresponding to the input address to only the first memory array or the second memory array if the indicator has a second status value.

19 Claims, 4 Drawing Sheets

Related U.S. Application Data division of application No. 14/171,051, filed on Feb. 3, 2014, now Pat. No. 9,158,607, which is a division of application No. 13/291,419, filed on Nov. 8, 2011, now Pat. No. 8,645,752.

(51) Int. Cl.
*G11C 15/00* (2006.01)
*G11C 29/08* (2006.01)

(56) References Cited

U.S. PATENT DOCUMENTS

| | | | |
|---|---|---|---|
| 6,373,758 B1* | 4/2002 | Hughes | G11C 29/44 365/200 |
| 7,738,295 B2 | 6/2010 | Lee | |
| 7,836,258 B2 | 11/2010 | Brown et al. | |
| 8,230,286 B1 | 7/2012 | Foley | |
| 2002/0085431 A1 | 7/2002 | Jeon et al. | |
| 2005/0160326 A1 | 7/2005 | Boatright et al. | |
| 2005/0216667 A1 | 9/2005 | Cabot et al. | |
| 2007/0233948 A1 | 10/2007 | Fukuyama | |
| 2007/0234101 A1 | 10/2007 | Koktan et al. | |
| 2008/0043512 A1* | 2/2008 | Fukushi | G11C 7/1006 365/145 |
| 2009/0300413 A1 | 12/2009 | Chang | |
| 2009/0316460 A1* | 12/2009 | Orginos | G11C 29/4401 365/49.1 |
| 2010/0031096 A1 | 2/2010 | Di Iorio et al. | |
| 2010/0058109 A1 | 3/2010 | Chang et al. | |
| 2010/0124115 A1 | 5/2010 | Ha | |
| 2010/0131812 A1* | 5/2010 | Mohammad | G11C 29/44 714/723 |
| 2010/0174847 A1 | 7/2010 | Paley et al. | |
| 2011/0029751 A1 | 2/2011 | Nobunaga | |
| 2011/0051523 A1 | 3/2011 | Manabe et al. | |
| 2012/0054549 A1 | 3/2012 | Kwan et al. | |
| 2012/0151149 A1 | 6/2012 | Dubrovin et al. | |

\* cited by examiner

METHODS OF OPERATING A MEMORY DEVICE

RELATED APPLICATIONS

This application is a continuation of U.S. patent application Ser. No. 14/880,504, filed Oct. 12, 2015, which issued on Nov. 28, 2017 as U.S. Pat. No. 9,831,002 entitled "APPARATUSES AND METHODS FOR OPERATING A MEMORY DEVICE," which is a divisional of U.S. patent application Ser. No. 14/171,051, filed Feb. 3, 2014 entitled "APPARATUSES AND METHODS FOR OPERATING A MEMORY DEVICE," which issued on Oct. 13, 2015 as U.S. Pat. No. 9,158,607, which is a divisional of U.S. patent application Ser. No. 13/291,419, filed Nov. 8, 2011, entitled "APPARATUSES AND METHODS FOR OPERATING A MEMORY DEVICE," which issued on Feb. 4, 2014 as U.S. Pat. No. 8,645,752, each of which is hereby incorporated herein by reference in its entirety and made part of this specification.

BACKGROUND

A memory device, such as one including a memory cache, may include one or more problematic memory cells and/or one or more problematic groups of memory cells (e.g., columns and/or rows of memory cells).

BRIEF DESCRIPTION OF THE DRAWINGS

Embodiments of claimed subject matter are illustrated by way of example and not by way of limitation in the figures of the accompanying drawings, in which:

DESCRIPTION OF EMBODIMENTS

Figure 1:
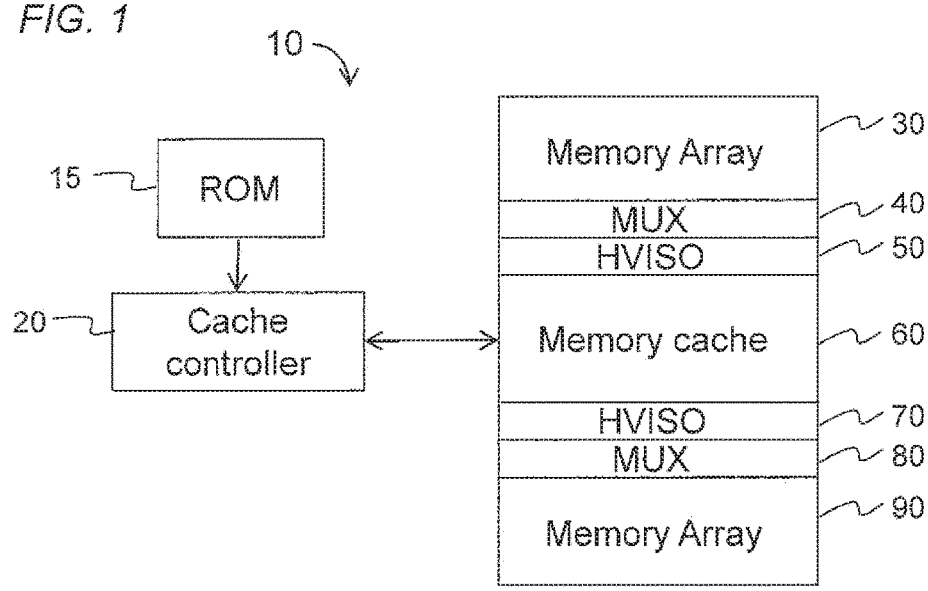
FIG. 1 is a diagram showing a portion of a memory device according to an embodiment.

In the following detailed description, reference is made to the accompanying figures that show, by way of illustration, specific embodiments of claimed subject matter. Embodiments are described in sufficient detail to enable those skilled in the art to practice claimed subject matter. It is to be understood that various embodiments of claimed subject matter, although different, are not necessarily mutually exclusive. For example, a particular feature, structure, and/or characteristic described herein in connection with one embodiment may be implemented in other embodiments of claimed subject matter. In addition, it is to be understood that a location or arrangement of individual elements within a disclosed embodiment may be modified. The following detailed description is, therefore, not to be taken in a limiting sense, and subject matter for the present application is determined by the issued claims, appropriately interpreted, along with a full range of equivalents to which the issued claims are entitled. In the drawings, like numerals refer to the same and/or similar aspects throughout the several views unless otherwise suggested.

Some portions of the following description are presented in terms of logic, algorithms, and/or symbolic representations of operations on data, which can be communicated as a physical signal(s) and/or stored and/or read as a programmed data state(s) of a memory cell(s) within an apparatus, such as a memory device, whether alone and/or as part of a special-purpose computing device or platform. In the context of the specification, the term "specific apparatus" or the like includes a general-purpose computing device that is programmed to perform particular functions pursuant to instructions from program software. Algorithmic descriptions and/or symbolic representations are examples of techniques used by those of ordinary skill in the data processing or related arts to convey the substance of their work to others skilled in the art. An algorithm is here, and generally, considered to be a self-consistent sequence of operations and/or similar data processing leading to a desired result. In this context, operations and/or processing involves physical manipulation of physical properties capable of being measured as physical quantities. Typically, although not necessarily, data may take the form of electrical and/or magnetic signals capable of being stored, communicated (e.g., transferred and/or received), combined, compared, and/or manipulated as data signals and/or data states. It has proven convenient at times, principally for reasons of common usage, to refer to such signals and/or states as bits, values, elements, symbols, characters, terms, numbers, numerals, information, and/or the like. It should be understood, however, that all of these or similar terms are to be associated with appropriate physical properties and/or are merely convenient labels. Unless specifically stated otherwise, as apparent from the following discussion, it is appreciated that throughout the specification, discussions utilizing terms such as "indicating," "directing," "reading," "storing," "detecting," "comparing," "suspending," "selecting," and/or the like may refer to actions and/or processes of a specific apparatus, such as a memory device, whether alone or as part of a special purpose computer or a similar special-purpose computing device. In the context of this specification, therefore, an apparatus, such as a memory device, a special purpose computer and/or a similar special-purpose computing device, is capable of manipulating and/or transforming signals and/or states, typically represented as physical electronic and/or magnetic quantities within, for example, memory devices (e.g., memories, registers, and/or other information storage devices), transmission devices, and/or display devices of a special purpose computer or similar special purpose computing device.

The terms "coupled" and/or "connected" along with their derivatives may be used. It should be understood that these terms are not intended as synonyms for each other. Rather, in particular embodiments, "connected" may be used to indicate that two or more elements are in direct physical and/or electrical contact with each other. "Coupled" may be used to indicate that two or more elements are in direct or indirect (with other intervening elements between them) physical and/or electrical contact with each other, and/or that the two or more elements cooperate and/or interact with each other.

FIG. 1 shows at least a portion of a memory device (10) according to an embodiment. In FIG. 1, memory cache 60 may be physically located between memory arrays 30 and 90, such as to reduce transit time of data signals between cache 60 and arrays 30 and 90. However, embodiments are not limited to particular configurations of memory arrays 30 and 90 with respect to memory cache 60. For example, in at least one other implementation, memory cache 60 may be located proximate with one of memory arrays 30 and/or 90.

Arrays 30 and/or 90 may include flash memory in a possible implementation. A memory cell of flash memory may store data by storing charge on a charge storage structure, such as a floating gate or a charge trap, in a field effect transistor (FET), for example. In an implementation, removing and/or storing charge on such a charge storage structure operates to alter a threshold voltage of the transistor, thereby programming the cell into one of a plurality of data states. The data state of such a cell can be read to indicate the data stored in the cell. In some implementations, the plurality of data states can comprise more than two data states, such that programming the cell to one of the more than two data states allows the cell to store more than one bit of data. Such a cell may be referred to as Multi-Level Cell (MLC). Arrays 30 and/or 90 of FIG. 1 may, however, comprise any type of memory cell (e.g., a phase change memory cell, a RRAM memory cell, a MRAM memory cell, etc.) arranged in any type of architecture, including, for example, a NOR (multiple or single level) architecture and/or NAND (multiple or single level) architecture; however, claimed subject matter is not necessarily limited in this respect.

In an implementation, memory arrays 30 and/or 90 may include "non-redundant" and "redundant" groups of memory cells, such as columns of memory cells (which are sometimes also referred to herein as "memory columns" or simply "columns"), in which functioning redundant memory columns may be substituted for problematic non-redundant memory columns. In an implementation, for example, memory arrays 30 and 90 may include 2048 non-redundant columns and 32 redundant columns, both of which may be divided evenly among arrays 30 and 90. A memory cell may be considered problematic if, for example, testing (whether as part of a production process or during operation) determines (e.g., detects) the cell to be problematic (which in some cases may be regardless of whether the cell actually is problematic). In one example of such testing, a cell may be determined to be problematic if data read from the cell does not correspond to data known to have been programmed (e.g., written) to the cell. Likewise, a memory column may be considered problematic if one or more memory cells of the column are determined to be problematic. It is understood that the terms "problematic memory cell" and "problematic memory column" may be used interchangeably and that the particular context of the usage will provide the intended meaning.

In an implementation, redundant memory columns may be used as replacements for problematic columns of memory arrays 30, 90 and/or memory cache 60. For example, if a particular non-redundant column of memory array 30 includes a problematic memory cell, the data stored in or to be stored in a column that includes the problematic memory cell may be stored in a redundant column. However, although column redundancy is described herein, other embodiments may employ a variety of redundancy schemes, such as row-redundant or other redundant memory schemes, and claimed subject matter is not limited to a particular redundant memory scheme.

In an implementation, read only memory (ROM) 15 may provide non-redundant and/or redundant column addresses to cache controller 20, such as, for example, by way of an FFH command after power up of memory device 10. In an example, during production of a memory device, such as 10, memory cells of memory cache 60, memory arrays 30 and 90, multiplex buses (MUX) 40 and 80, and high-voltage isolation (HVISO) circuitry 50 and 70 may undergo yield testing to detect operation of the memory device according to acceptance criteria. In an implementation, production yield testing may include comparing a pattern of data read from the memory cache and/or the memory arrays with a test pattern of data programmed to the memory cache and/or the memory arrays. Differences between patterns of data may be used to determine (e.g., identify) locations of problematic memory cells, such as an address of an individual problematic cell or an address of a group (e.g., column or row) of cells including a problematic cell, for memory arrays 30, 90 and/or memory cache 60. In an example, addresses of problematic memory cells and/or columns of memory cache 60 may be determined and stored in ROM 15 and may be used to adjust circuits and other components of memory device 10. However, this is merely an example, and claimed subject matter is not limited in this respect.

In an implementation, cache controller 20 may comprise decoding circuitry, e.g., column address decoding circuitry (not shown), such as logic, for example. Cache controller 20 may comprise wordline and/or bitline select input nodes for memory cache 60. Typically, a node may comprise one or more ports or terminals. Cache controller 20 may also be configured to store program code data in, and read program code data from, memory cells of memory cache 60 along with memory arrays 30 and/or 90. In an implementation, cache controller 20 and memory cache 60 may alternately interface with memory arrays 30 and 90 in a manner that may execute a first block memory operation using a first memory array while initiating a second block memory operation with a second memory array, for example, thus potentially reducing delay in memory operation overall.

Figure 2:
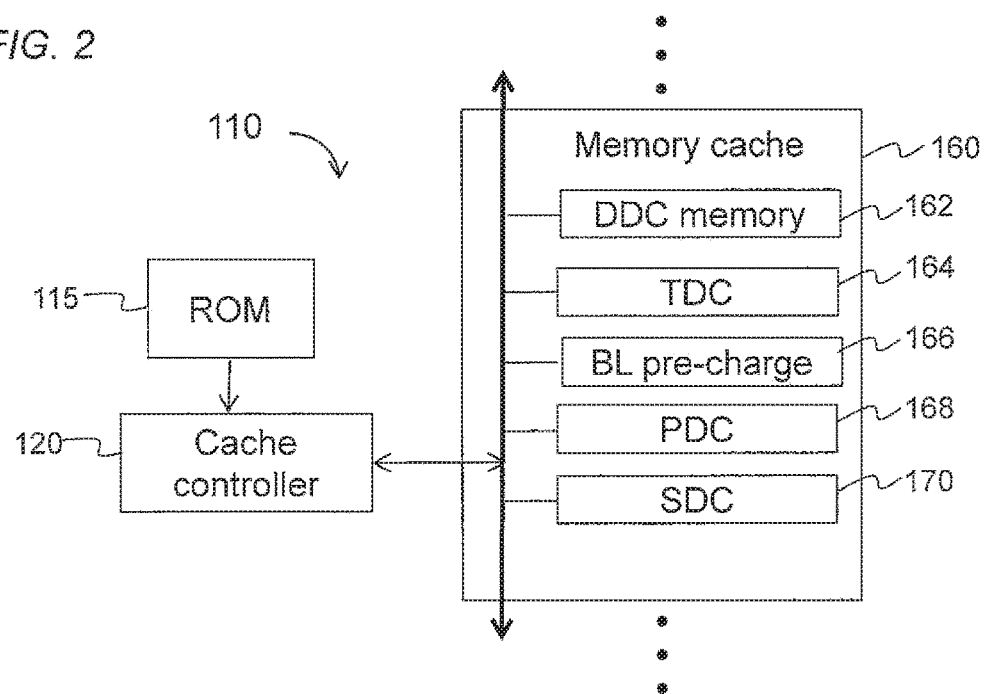
FIG. 2 is a diagram showing a portion of the memory device shown in the embodiment of FIG. 1.

FIG. 2 is a diagram showing a portion (110) of the embodiment of FIG. 1. In an implementation, memory cache 160 may include dynamic data cache memory (DDC memory) 162 that may provide, for example, interim storage of runtime program-execution results comprising data that may be stored in memory arrays 30 and/or 90 of FIG. 1. DDC memory 162 may also provide interim storage of runtime program-execution results comprising data that may be read from memory arrays 30 and/or 90. Memory cache 160 may also include temporary data cache (TDC) 164, bit line pre-charging circuit (BL pre-charge) 166, primary data cache (PDC) 168, and secondary data cache (SDC) 170, under the control of cache controller 120, which may, for example, access memory addresses stored in ROM 115 of problematic cells and/or problematic columns. Thus, in an embodiment, DDC memory 162 may be a component of a memory cache. However, this is merely an example configuration, and claimed subject matter is not limited in this respect.

In an implementation, BL pre-charge circuit 166 may generate voltage and/or current signals that may be applied to even and/or odd bit lines during even and/or odd page selection by cache controller 120, for example. TDC 164 may provide temporary storage of data within memory cache 160 as data may be moved between PDC 168, SDC 170, and DDC memory 162, for example. Likewise, SDC 170 may provide interim storage of runtime program-execution results according to instructions contained in a user program, as an example.

In an implementation, which may occur during a power-up sequence of a memory device, for example, cache controller 120 may access a list of problematic memory cells (e.g., a list of addresses of problematic memory cells and/or columns of memory arrays 30 and/or 90) from ROM 115. A list of problematic memory cells may enable cache controller 120 to, for example, store data in redundant memory columns of arrays 30 and/or 90 instead of attempting to store data in columns including one or more problematic memory cells. In an implementation, ROM 115 may additionally store addresses of problematic memory cells and/or columns of DDC memory 162. Thus, in an embodiment, redundant columns of memory arrays 30 and/or 90 may be employed to mitigate not only the effects of problematic cells of memory arrays 30 and/or 90 but to also mitigate the effects of problematic memory cells of DDC memory 162 as well.

Figure 3:
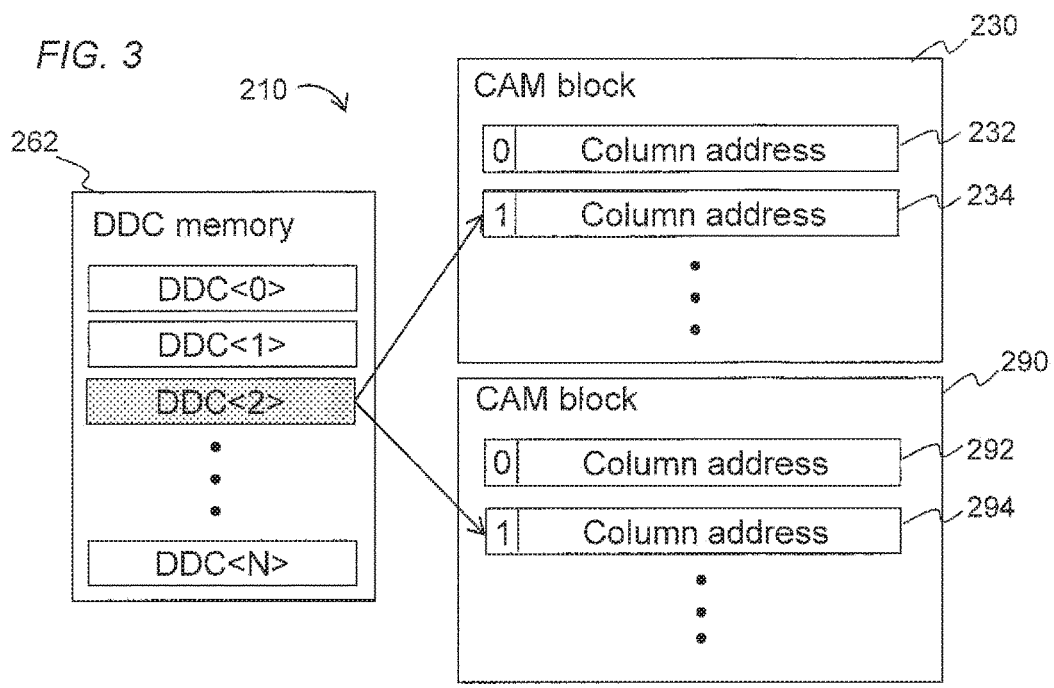
FIG. 3 is a diagram showing interaction between portions of the memory device shown in the embodiment of FIG. 1.

FIG. 3 is a diagram showing interaction between portions (210) of the embodiment of FIG. 1. Cache controller 20/120 and ROM 15/115 are not shown in FIG. 3. In an implementation, DDC memory 262, which may correspond to DDC memory 162 of FIG. 2, may comprise columns of memory cells arranged as DDC<0> through DDC<N>. Columns of DDC memory 262 may be arranged into a content addressable memory block that may be shared by memory arrays 30 and 90 of FIG. 1, for example, and configured to access (e.g., to program to and/or read from) the array(s).

In an implementation, fuse groups 230 and 290 may comprise fuse groups of a content-addressable memory (CAM) which may allow a pattern of data at an input node to be compared with patterns of data stored in the CAM to detect a match. If a match is detected, a CAM location may convey a "hit" signal to a cache controller, for example. However, this is merely an example and claimed subject matter is not limited in this respect.

In an implementation, one or more memory cells within non-redundant columns of memory arrays 30 and/or 90 may undergo a production test operation that may result in a determination that one or more columns of memory arrays 30 and/or 90 is problematic, for example, as described previously. In an implementation, a CAM may be used to remap data of a corresponding number of problematic non-redundant columns to redundant columns if a "hit" signal were reported based on a comparison via a CAM, for example. In an implementation, storing addresses of problematic non-redundant memory cells or addresses of problematic non-redundant memory columns may be beneficial, for example, so that data may be stored in and/or read from redundant columns instead. For example, as a result of remapping to a redundant column, memory performance in general should not be significantly degraded.

Likewise, storing data into redundant columns of a memory array may involve the use of one or more CAM fuse groups, for example, which may mask problematic memory columns during a memory scan operation. This may assist in maintaining adequate memory performance in remapping situations. In an implementation, a CAM fuse group may comprise one or more fuses that may mask out a non-redundant column comprising a problematic memory cell and replace a non-redundant masked column with a redundant replacement column. In a particular example, if a first memory column may be problematic, access to a problematic column may be masked by way of one or more fuses placed in a high-resistance state to electrically isolate a problematic column from an interfacing logic circuit. In a similar manner, one or more fuses may couple redundant columns to replace a problematic non-redundant column to an interfacing logic circuit. Of course, claimed subject matter is not limited in scope to this particular approach. A variety of approaches is possible within the scope of claimed subject matter.

In FIG. 3, fuses 232 and 292, for example, may be used to store column address data corresponding to addresses of problematic columns of memory array 30 and 90, respectively. At a fuse within, for example, fuses 232 corresponding to the leftmost bit position, for example, of the column address data, a data value of 0 may be stored while a corresponding problematic column address may be stored using other fuses within fuses 232 (corresponding to bit positions to the right of the leftmost bit position). Of course, claimed subject matter is not limited in scope to this particular approach. Again, a variety of approaches is possible within the scope of claimed subject matter. In an implementation, a data value of 0 stored in such a fuse may indicate that the corresponding problematic column address is of one or more problematic memory cells of a memory array, e.g., a problematic memory column of memory array 30. However, in other implementations, additional data and/or different values of data may be used, and claimed subject matter is not limited in this respect so long as a technique permits determination, as desired.

In an implementation, a production test operation may seek to determine (e.g., detect) problematic memory cells of DDC memory 262 in addition to determining problematic memory cells of memory arrays 30 and/or 90. Determination of problematic memory cells of DDC memory 262 may indicate potential failure of data that may be read from or programmed to problematic columns of DDC memory 262, as an example. In FIG. 3, failure, such as degradation, of a memory cell of DDC memory 262 may result in one or more corrupted bits of data being stored, such as during a program loading operation, from a DDC memory column to one or more columns of memory array 30 and/or 90. For example, fuse groups 230 and/or 290 may be scanned to detect a match between an input address and a problematic column address, for example. A problematic memory cell of DDC memory 262, if not handled appropriately, may result, at least in part, in corrupt data being stored in columns of memory arrays 30 and/or 90. Accordingly, one or more of fuse groups 230 and/or 290 may report that a match between an input address and a problematic column address has been found, such as via a CAM, as described for an example embodiment. A report that a match has been found may be due, at least in part, to a problematic DDC memory column and may, therefore, not be necessarily indicative of a matching pattern of data between an input address and a problematic column address of a memory array, for example.

To indicate that a problematic column of DDC memory 262 has been detected during a production test operation, an indicator corresponding to a data value of 1, for example, may be stored in a fuse within, for example, fuses 234 corresponding to a leftmost bit position of stored column address data. In another implementation, a data value of 0, for example, may be stored instead as such an indicator. In an implementation, a cache controller may read an indicator, which may be used by a cache controller to differentiate, for example, a problematic memory column of a memory cache of a memory device from a problematic memory column of a memory array of the device. In addition, an address of a problematic column within DDC memory 262 may be stored, for example, using at least some of the remaining fuses of fuses 234, for example. This data may be loaded into fuses 234 and 294 from ROM 115, for example, after power up of a memory device that comprises memory arrays 230, 290 and DDC memory 262. In an implementation, storing such an indicator in the memory arrays 230 and/or 290 may allow access to an address for a redundant column to replace a column containing a problematic memory cell.

In at least some implementations, a user operating a memory device comprising arrays 30 and 90 may designate one of memory arrays 30 or 90 as "primary" and may designate another memory array as "secondary" in accordance with a program, such as a user-defined program or a hardware embedded program, for example. These designations may in some embodiments not depend on a DDC memory operating state and may also be changed from time to time, perhaps as a function of user programming operations, for example. Therefore, having a problematic column of DDC memory 262 may result in an ambiguity as to whether the location of the corresponding replacement column is within memory array 30 or 90 ("primary" or "secondary").

In FIG. 3, for example, DDC<2> may be identified, perhaps during a production test operation, as including one or more problematic memory cells, which may result in incorrect data being read from and/or stored in DDC<2>. In an implementation, if a column of DDC memory 262 is determined to be problematic, communications between DDC memory 262 and a secondary data cache may be temporarily suspended, for example. Suspension may be advantageous during program loading operations wherein a potential may exist for programming corrupt data from DDC memory 262 into a secondary data cache. After a brief period, in which a redundant column of a memory array may be accessed in place of a location within the DDC memory 262, communications between memory 262 and a secondary data cache may be reestablished.

However, as mentioned above, an ambiguity may be present as to which memory array may be primary and which may be secondary. Therefore, in an implementation, detection of a problematic memory cell of DDC memory 262 may result in disabling separate redundant columns of the memory arrays, such as 30 and 90, for example. As a result, the same data may be stored in and/or read from both arrays regardless of which may be primary and which may be secondary. Thus, to handle detection of a problematic column of DDC memory, a memory device may employ a "global replace," e.g., two redundant columns may be employed for a problematic column regardless of whether the problematic column is located in DDC memory or in a memory array. This may occur if, during remapping, a memory device is not able to differentiate a problematic column of DDC memory from a problematic column of a memory array. Typically, of course, not every problematic column is located in DDC memory. Rather, typically, it is more likely for the memory arrays to have problematic columns. Nonetheless, for the example of 32 column replacements, a "global replace" implies as few as 16 column replacements may be accommodated, rather than 32, for this example.

However, for an implementation in which remapping is able to differentiate (e.g., distinguish) a location of a problematic cell of a memory cache from a location of a problematic memory cell of an array, although a problematic column of DDC memory may consume, for example, two redundant columns, a problematic column of a memory array may still employ, for example, only one redundant column as a replacement column. Using DDC<2> as an example of a problematic column of DDC memory, a data value of 1 may be stored as the leftmost portion of column address data stored in fuses 234 of fuse group 230 and as the leftmost portion of column address data stored in fuses 294 of fuse group 290, as described for a possible embodiment. A column address corresponding to DDC<2> may, for an implementation, be stored using some or all of the remaining fuses 234 and 294. In this example, two redundant columns may be employed for DDC<2> to address the memory array ambiguity discussed previously. The two redundant columns may then be used to store the same data, as described before. However, in an embodiment, such an approach is not applied for problematic columns located in the memory arrays. Therefore, for one or more embodiments, more problematic columns may be handled even if DDC memory contains one of the problematic columns.

Figure 4:
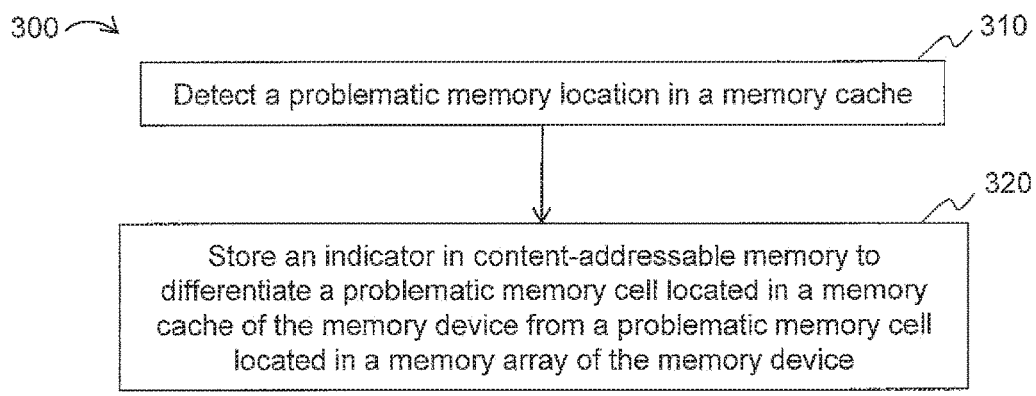
FIG. 4 shows a flow chart for a method of operating a memory device according to an embodiment.

FIG. 4 shows a flow chart (300) for a method of operating a memory device according to an embodiment. In some embodiments, the device of FIG. 1 may be suitable for performing the method of FIG. 4, although nothing prevents performing the method of FIG. 4 using alternate arrangements of components in other embodiments. Embodiments may include additional blocks than those shown and/or described in FIG. 4, fewer blocks, blocks occurring in an order different from FIG. 4, or any combination thereof.

At block 310, a problematic memory cell or column may be detected. In an implementation, block 310 may result from one or more operations of a test operation conducted, for example, during a production operation or as part of a test operation periodically performed during operation of the memory device. In an example, data read from memory cells may be compared with known data programmed to memory cells. Results of a test operation, which may take the form of a record (e.g., a list) of addresses of problematic memory cells or groups (e.g., columns) of memory cells, may be stored in a ROM accessible to a cache controller, as an example. During or after a power-up sequence, for example, a cache controller may program data representing problematic memory columns to one or more memory arrays, for example.

Continuing, as shown at block 320, an indicator may be stored in the memory device, such as in content-addressable memory, to differentiate a location of a problematic memory cell (e.g., an address of a single memory cell or of a group of memory cells, such as a column, of memory cells) of a memory cache of the memory device from a location of a problematic memory cell of a memory array of the memory device. In an implementation, one such indicator can include a single bit of data stored in a fuse corresponding to a particular bit position of column address data stored in the CAM. The indicator may be used to indicate that data of a memory cache may be stored in redundant columns of more than one memory arrays. If a problematic memory cell or column is located in a memory array, the indicator may be used to indicate that a redundant column in a single memory array is used to replace the column containing the problematic memory cell.

Figure 5:
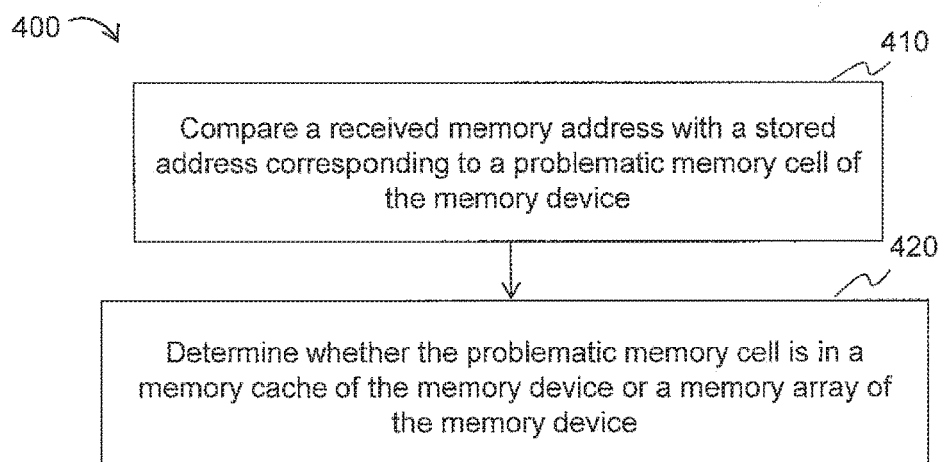
FIG. 5 shows a flow chart for a program code loading operation involving a memory device according to an embodiment.

FIG. 5 shows a flow chart (400) for a program code loading operation involving a memory cache according to an embodiment. In some embodiments, the device of FIG. 1 may be suitable for performing the method of FIG. 5, although nothing prevents performing the method of FIG. 5 using alternate arrangements of components in other embodiments. Embodiments may include additional blocks than those shown and/or described in FIG. 5, fewer blocks, blocks occurring in an order different from FIG. 5, or any combination thereof.

At block 410, a received memory address may be compared with stored data of a content-addressable memory, wherein the stored data might include addresses of problematic memory cells or columns in the memory device. In an implementation, block 410 may be performed as part of a sequence of code programming operations in which data may be stored in a secondary data cache of a memory device, for example. Block 420 may include determining a status of an indicator (e.g., a value of a bit of data stored in a fuse) and an address of a problematic memory cell or column in the memory device.

In an implementation, if the value of a particular bit of data stored in content-addressable memory is determined to be, for example, a logic 0, it indicates that a location of a problematic memory cell is not in memory cache (and a corresponding column address may be retained in the memory cache). The column address may be provided as part of a sequence of memory operations, such as reading or programming a memory block. In an implementation, data, which may represent data provided as part of a user program, for example, may be programmed to the column address of a secondary data cache.

Figure 6:
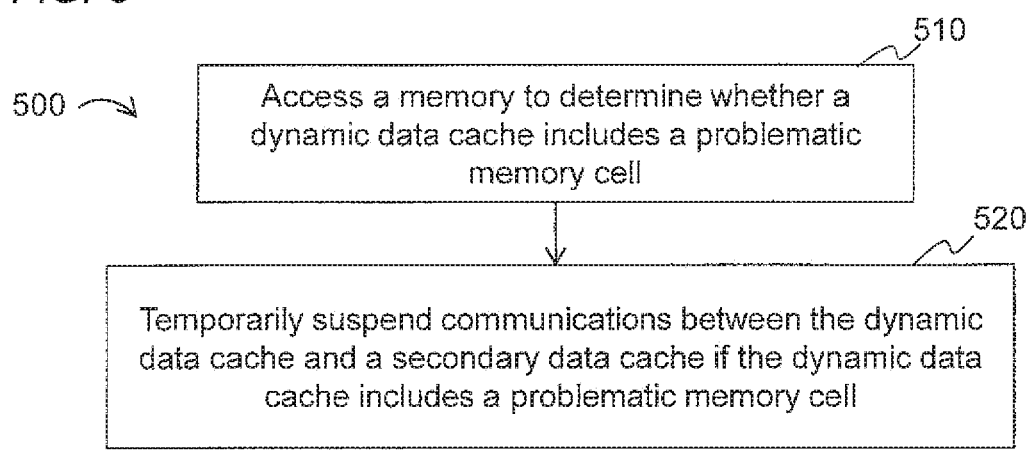
FIG. 6 shows a flow chart for a memory scan involving a memory device according to an embodiment.

FIG. 6 shows a flow chart (500) for a memory scan involving a memory device according to an embodiment. In some embodiments, the device of FIG. 1 may be suitable for performing the method of FIG. 6, although nothing prevents performing the method of FIG. 6 using alternate arrangements of components in other embodiments. Embodiments may include additional blocks than those shown and/or described in FIG. 6, fewer blocks, blocks occurring in an order different from FIG. 6, or any combination thereof.

Block 510 includes accessing a content-addressable memory to differentiate whether a location of a problematic memory cell is in a memory cache or a memory array. In an implementation, block 510 may result, at least in part, from accessing a read-only memory comprising column address data, including addresses corresponding to, for example, a problematic cell or column, which might include a problematic cell or column of a memory cache, for example. Continuing at block 520, communications between a dynamic data cache and a secondary data cache may be temporarily suspended, such as to preclude erroneous data from being programmed from the dynamic data cache to the secondary data cache due to a problematic cell or column of the dynamic data cache. In an implementation, communications between a dynamic data cache and a secondary data cache may be reestablished after remapping, for example, a problematic column of the dynamic data cache to a redundant memory column(s) of a memory array(s).

In some circumstances, operation of a memory device, such as a change in a bit of data from logic 1 to logic 0 or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation of stored charge and/or a release of stored charge. Likewise, in other memory devices, a change of state may comprise a physical change, e.g., transformation in magnetic orientation and/or transformation in molecular structure, such as from crystalline to amorphous or vice-versa. In still other memory devices, a change in physical state may involve quantum mechanical phenomena, such as, superposition, entanglement, or the like, which may involve quantum bits (qubits), for example. The foregoing is not intended to be an exhaustive list of all examples in which a change in state for a binary one to a binary zero or vice-versa in a memory device may comprise a transformation, such as a physical transformation. Rather, the foregoing are intended as illustrative examples.

A computer-readable (storage) medium typically may be non-transitory and/or comprise a non-transitory device. In this context, a non-transitory storage medium may include a device that is tangible, meaning that the device has a concrete physical form, although the device may change its physical state. Thus, for example, non-transitory refers to a device remaining tangible despite this change in state.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. However, it should be noted that this is merely an illustrative example and claimed subject matter is not limited to this example.

Methodologies described herein may be implemented by various approaches depending, at least in part, on applications according to particular features and/or examples. For example, such methodologies may be implemented in hardware, firmware and/or combinations thereof, along with software. In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, electronic devices, other devices units designed to perform the functions described herein, and/or combinations thereof.

In the preceding detailed description, numerous specific details have been set forth to provide a thorough understanding of claimed subject matter. However, it will be understood by those skilled in the art that claimed subject matter may be practiced without these specific details. In other instances, methods and/or devices that would be known by one of ordinary skill have not been described in detail so as not to obscure claimed subject matter.

While there has been illustrated and/or described what are presently considered to be example features, it will be understood by those skilled in the art that various other modifications may be made, and/or equivalents may be substituted, without departing from claimed subject matter. Additionally, modifications may be made to adapt a particular situation to the teachings of claimed subject matter without departing from one or more central concept(s) described herein. Therefore, it is intended that claimed subject matter not be limited to the particular examples disclosed, but that such claimed subject matter may also include all aspects falling within the scope of appended claims, and/or equivalents thereof.

What is claimed is:

1. A method of operating a memory device, the method performed by the memory device comprising:

comparing an input address to one or more addresses stored in the memory device, wherein each stored address of the one or more addresses stored in the memory device are indicative of problematic memory cells of the memory device;

if the input address matches a stored address of the one or more addresses stored in the memory device, determining a status value of an indicator corresponding to the matched address;

if the indicator has a first status value indicative of a problematic memory cell in a memory cache of the memory device, storing data corresponding to the input address to a first memory array of the memory device, and storing the data corresponding to the input address to a second memory array of the memory device; and if the indicator has a second status value different than the first status value, storing the data corresponding to the input address to only the first memory array or the second memory array;

wherein the memory cache is configured for communication with the first memory array and is configured for communication with the second memory array.

2. The method of claim 1, further comprising:

programming known patterns of data to memory cells of the first memory array, to memory cells of the second memory array, and to memory cells of the memory cache of the memory device;

reading the memory cells of the first memory array, the second memory array and the memory cache;

if the data read from a memory cell of the memory cache is different than the data known to be programmed into that memory cell, storing an address corresponding to that memory cell in a third memory array of the memory device and in a fourth memory array of the memory device, and storing an indicator corresponding to that address and having the first status value in the third memory array and in the fourth memory array; and if the data read from a memory cell of the first memory array is different than the data known to be programmed into that memory cell, storing an address corresponding to that memory cell in the third memory array, and storing an indicator corresponding to that address and having a second status value in the third memory array; and if the data read from a memory cell of the second memory array is different than the data known to be programmed into that memory cell, storing an address corresponding to that memory cell in the fourth memory array, and storing an indicator corresponding to that address and having the second status value in the fourth memory array.

3. The method of claim 2, wherein storing an address in the third memory array comprises storing that address in a first content-addressable memory array of the memory device, and wherein storing an address in the fourth memory array comprises storing that address in a second content-addressable memory array of the memory device.

4. The method of claim 1, further comprising storing each address of the one or more addresses to one or both of a third memory array of the memory device and a fourth memory array of the memory device prior to comparing the input address.

5. The method of claim 4, wherein storing each address of the one or more addresses to one or both of the third memory array and the fourth memory comprises storing each address of the one or more addresses from a read-only memory of the memory device.

6. The method of claim 4, wherein storing each address of the one or more addresses to one or both of the third memory array and the fourth memory comprises storing a particular address to the third memory array and storing the particular address to the fourth memory array if an indicator corresponding to the particular address has the first status value.

7. The method of claim 6, further comprising storing the particular address to only the third memory array or the fourth memory array if the indicator corresponding to the particular address has a second status value.

8. The method of claim 1, wherein storing the data corresponding to the input address to the first memory array and to the second memory array comprises storing the data corresponding to the input address to redundant memory cells of the first memory array, and storing the data corresponding to the input address to redundant memory cells of the second memory array.

9. A method of operating a memory device, the method performed by the memory device comprising:

comparing an input address to one or more addresses stored in the memory device, wherein each address of the one or more addresses comprises a corresponding indicator having a status value, and wherein each address of the one or more addresses is stored in at least one memory array selected from a group consisting of a first memory array of the memory device and a second memory array of the memory device;

if the input address matches a stored address of the one or more addresses, determining a status value of an indicator corresponding to the matched address;

if the indicator has a first status value indicative of a problematic memory cell in a memory cache of the memory device, storing data corresponding to the input address to a third memory array of the memory device and to a fourth memory array of the memory device;

if the indicator has a second status value different than the first status value, and the stored address is stored in the first memory array, storing the data corresponding to the input address to the third memory array without storing the data corresponding to the input address to the fourth memory array; and if the indicator has the second status value, and the stored address is stored in the second memory array, storing the data corresponding to the input address to the fourth memory array without storing the data corresponding to the input address to the third memory array.

10. The method of claim 9, wherein, when the indicator has the first status value, the input address corresponds to an address of a memory cache of the memory device comprising the first memory array and the second memory array, and in communication with the third memory array and the fourth memory array.

11. The method of claim 10, wherein, when the indicator has the second status value, the input address corresponds to an address of the third memory array or to an address of the fourth memory array.

12. The method of claim 9, wherein, for each address of the one or more addresses stored in the memory device, the method further comprises:

storing that address to the first memory array and to the second memory array prior to comparing the input address if its corresponding indicator has the first status value;

storing that address to the first memory array prior to comparing the input address if its corresponding indicator has the second status value and that address corresponds to a memory cell of the third memory array; and storing that address to the second memory array prior to comparing the input address if its corresponding indicator has the second status value and that address corresponds to a memory cell of the fourth memory array.

13. The method of claim 9, wherein storing the data corresponding to the input address to the third memory array comprises storing the data corresponding to the input address to at least one redundant memory cell of the third memory array; and wherein storing the data corresponding to the input address to the fourth memory array comprises storing the data corresponding to the input address to at least one redundant memory cell of the fourth memory array.

14. The method of claim 13, wherein storing the data corresponding to the input address to the third memory array further comprises storing the data corresponding to the input address to a redundant column of the third memory array, and wherein storing the data corresponding to the input address to the fourth memory array further comprises storing the data corresponding to the input address to a redundant column of the fourth memory array.

15. The method of claim 14, wherein storing the data corresponding to the input address to the redundant column of the third memory array further comprises masking out a non-redundant column of the third memory array, and wherein storing the data corresponding to the input address to the redundant column of the fourth memory array further comprises masking out a non-redundant column of the fourth memory array.

16. A method of operating a memory device, the method performed by the memory device comprising:
    comparing an input address to one or more addresses stored in the memory device, wherein each stored address of the one or more addresses stored in the memory device are indicative of problematic memory cells of the memory device;
    if the input address matches a stored address of the one or more addresses stored in the memory device, determining whether a status value of an indicator corresponding to the matched address has a first status value indicative of the matched address corresponding to an address of a dynamic data cache of the memory device or a second status value indicative of the matched address corresponding to an address of a memory array of the memory device, wherein the memory array comprises a first memory array and a second memory array in communication with the dynamic data cache; and
    if the indicator has the first status value, storing data corresponding to the input address in the first memory array and storing the data corresponding to the input address in the second memory array; and
    if the indicator has the second status value, storing the data corresponding to the input address in the first memory array without storing the data corresponding to the input address in the second memory array, or storing the data corresponding to the input address in the second memory array without storing the data corresponding to the input address in the first memory array.

17. The method of claim 16, wherein, if the indicator has the second status value, the method further comprises:
    determining whether the matched address is stored in a first memory location of the dynamic data cache or in a second memory location of the dynamic data cache;
    storing the data corresponding to the input address in the first memory array if the matched address is stored in the first memory location; and
    storing the data corresponding to the input address in the second memory array if the matched address is stored in the second memory location.

18. The method of claim 16, further comprising receiving the input address as part of reading or programming the memory device.

19. The method of claim 16, wherein, if the indicator has the first status value, the method further comprises:
    temporarily suspending communication between the dynamic data cache and a secondary data cache of the memory device; and
    reestablishing communication between the dynamic data cache and the secondary data cache after accessing redundant memory cells of the first memory array and the second memory array.

* * * * *